United States Patent [19]

Foulke

[11] Patent Number: 4,601,521
[45] Date of Patent: Jul. 22, 1986

[54] ROLLING APPARATUS
[75] Inventor: Richard F. Foulke, Carlisle, Mass.
[73] Assignee: Proconics International, Inc., Woburn, Mass.
[21] Appl. No.: 611,418
[22] Filed: May 17, 1984
[51] Int. Cl.[4] .................. F16C 29/04; E05D 13/02
[52] U.S. Cl. .................................. 384/54; 16/98; 152/323; 301/63 PW; 384/543
[58] Field of Search .............. 308/3.8, 6 R, 6 A, 6 B, 308/195, 190, 203, 193, 204; 16/98, 109; 301/63 PW; 152/323, 380; 384/543, 586, 546, 587

[56] References Cited
U.S. PATENT DOCUMENTS 3,756,670  9/1973  Harris ................................. 308/6 R
3,929,327  4/1974  Olson ................................. 271/250
4,109,343  8/1978  Weis et al. ........................... 16/98

Primary Examiner—Stuart S. Levy
Assistant Examiner—David Werner

[57] ABSTRACT

Rolling apparatus comprising a support member, first bearing means connected to the support member for rotating relative to the support member, and a first tire of material softer than the bearing means mounted on the circumference of the bearing means, the tire having a circumference that increases from a smaller diameter side to a larger diameter side and a lip extending radially inward over a portion of the bearing means on the larger diameter side of the tire, whereby the lip is biased against the bearing means as the tire travels, and is prevented from moving off the bearing means at either side.

15 Claims, 4 Drawing Figures

ROLLING APPARATUS

BACKGROUND OF THE INVENTION

This invention relates to rollers useful, e.g., in apparatus for placing semiconductor wafers in holders or boats.

Apparatus for transferring semiconductor wafers from plastic storage boats to quartz processing boats, and vice versa, is described in U.S. Pat. No. 4,493,606, which is hereby incorporated by reference. In this apparatus, the plastic and quartz boats are supported on trolleys that move the wafers past a pickup arm via metal rollers rolling along tracks located within the apparatus. In moving the wafers between the boats, it is desirable to avoid introduction of contamination onto the surfaces of the wafers. Such contamination can arise from scraping and sliding of parts within the apparatus being used to accomplish the transfer.

SUMMARY OF THE INVENTION

In general, the invention features rolling apparatus useful, e.g., to provide rolling for trolleys in wafer placement apparatus, the rolling apparatus including a support member, bearing means connected to the support member for rotating relative to said support member, and a tire of material softer than the bearing means mounted on the circumference of the bearing means, the tire having a circumference that increases from a smaller diameter side to a larger diameter side and a lip on the larger side of the tire, so that the soft tire is biased toward the smaller diameter side as it travels, and is prevented from coming off the bearing at either of its sides.

In preferred embodiments the tire is made of plastic (most preferably polyformaldehyde); the tire rolls along a track; the track has two surfaces inclined to the horizontal, and there are two tires, each engaging a different inclined surface; the track has two upper inclined surfaces and two lower inclined surfaces, and there is a tire engaging each inclined surface; and the circumferences of the tires increase away from the support member.

In the preferred application of the roller apparatus in apparatus operating in a contaminant free environment (most preferably apparatus transferring semiconductor wafers), the use of soft material acts to avoid particulate contamination resulting from interaction of moving hard parts.

Other features and advantages of the invention will be apparent from the following description of the preferred embodiment, and from the claims.

DESCRIPTION OF THE PREFERRED EMBODIMENT

We first briefly describe the drawings.

STRUCTURE

Figure 1:
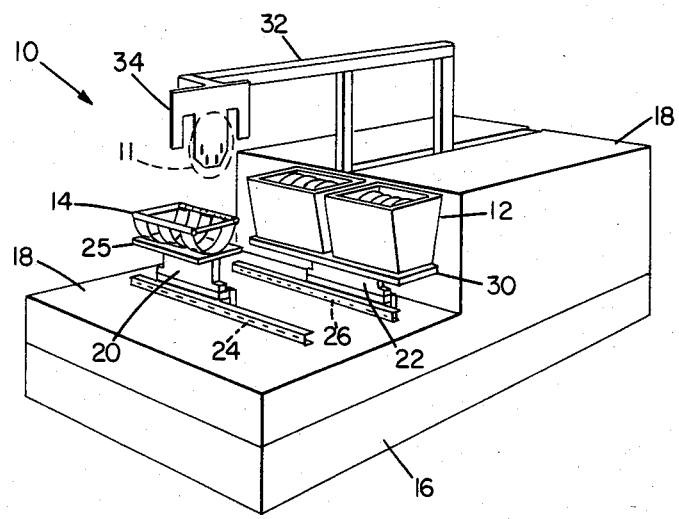
FIG. 1 is a perspective view of apparatus for moving semiconductor wafers from one carrier to another.

Referring to FIG. 1, there is shown wafer handling apparatus 10, for transferring semiconductor wafers 11 between plastic boats 12 and quartz boat 14. Apparatus 10 has base 16 upon which cover 18 rests, trolleys 20, 22 for transporting the boats, and wafer transfer arm 32. Trolleys 20, 22 extend through slots 24, 26, respectively, of cover 18. Trolley 20 has affixed to its upper end platform 25, which supports quartz boat 14. Trolley 22 has affixed to its upper end platform 30, which supports plastic boats 12. Arm 32 is connected to aluminum wafer paddle 34 for gripping wafers by vacuum engagement.

Figure 2:
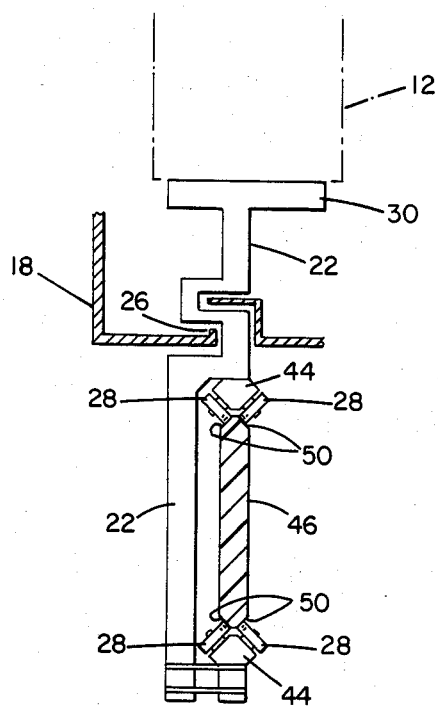
FIG. 2 is a vertical sectional view of a roller and track mechanism of the apparatus of FIG. 1.

Referring to FIG. 2, the roller and track mechanism for trolley 22 is shown. (A similar roller and track mechanism is used for trolley 20.) Aluminum track 46 has inclined surfaces 50 inclined at 45° to the horizontal and running longitudinally along its top and bottom. Trolley 22 is supported on track 46 by roller bars 44, each of which has a pair of rollers 28 resting on surfaces 50. Each roller 28 rotates on a stationary shaft which is pressed into a roller bar and held by a set screw. A spacer on the shaft prevents contact between roller 28 and roller bar 44, while a snap ring holds the roller on the shaft.

Figure 3:
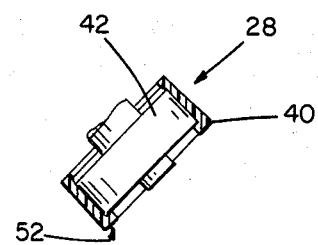
FIG. 3 is an elevation, partially in section, of a roller element of the FIG. 2 mechanism.

Referring to FIG. 3, roller 28 has a plastic tire 40 (#150 Delrin polyformaldehyde from DuPont) mounted on bearing 42 (R4 bearing, ABEC 5 tolerance, ⅝" o.d., ¼" bore, 0.195" wide).

Figure 4:
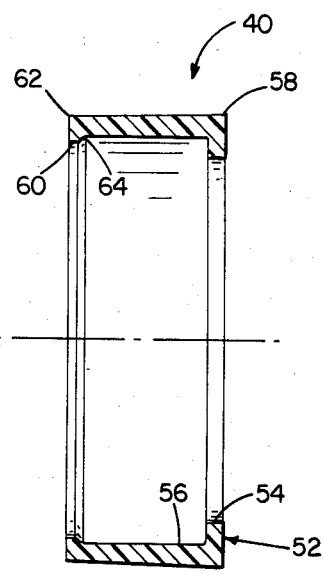
FIG. 4 is an enlarged vertical sectional view of the tire of FIG. 3 roller element.

Referring to FIG. 4, the circumference of tire 40 increases away from roller bar 44 (from left to right in FIGS. 3 and 4) at an angle of 1.5°±0.5° from 0.674/0.673" at edge 62 to 0.687" at edge 58. Lip 52 is 0.025" wide. Lip opening 54 is 0.562" in diameter. Inner surface 56 is 0.624/0.623" in diameter. Opening 60 at the left side of the tire is 0.611±0.001" in diameter. Inside corners 64 are at an angle of 40° to inner surface 60. The width of tire 40 is 0.240" from edge 58 to edge 62, and 0.189/0.192" along inner surface 56.

To insure the necessary outer dimensions of tire 40, the plastic is not machined to final dimensions until tire 40 has been mounted on bearing 42.

OPERATION

The overall operation of apparatus 10 in transferring wafers 11 between plastic boats 12 and quartz boat 14 is described in the above-mentioned patent application. During the transfer process, trolleys 20, 22 move along their respective tracks to align different wafers and slots of boats 12, 14 with paddle 34. Cover 18 inhibits contaminants from surfacing.

Precise contaminant free movement of trolleys 20, 22, is provided by using soft plastic tires 40, which resist chipping and abrading, thus eliminating particulate contaminants associated with the abrasion of metal or with hard surface rollers on a metal track. Also, use of plastic tires 40 permits the use of aluminum for track 46, something which can be more easily machined than harder metals that are used to avoid contamination with metal rollers.

As a tire 40 engages track 16 at an inclined surface 50, the increasing circumference of the tire away from roller bar 44 biases the tire toward the roller bar, preventing the soft tire from moving outward, and the tire is prevented from moving off the bearing and into the roller bar by means of tire lip 52.

OTHER EMBODIMENTS

Other embodiments are within the following claims. E.g., the tire may be made of other plastics, and the small lip at opening 60 is not needed to hold tire 40 in place. The bearing may be of a different manufacture. The roller may be used in conjunction with other machines, particularly those needing a contaminant-free environment.

I claim:

1. Rolling apparatus comprising
   a support member,
   first bearing means connected to said support member for rotating relative to said support member, said bearing means having a cylindrical surface over the entire outer diameter surface, and
   a first tire of material softer than said bearing means mounted on said cylindrical outer diameter surface of said bearing means, said tire having a circumference that increases from a smaller diameter side to a larger diameter side, an opening on the smaller diameter side, an opening on the larger diameter side, and a lip extending radially inward over a portion of said bearing means on the larger diameter side of said tire a sufficient amount to prevent said bearing means from passing through the opening on said larger diameter side, the opening on the smaller diameter side being larger than said opening on said larger diameter side and being sufficiently large so as to not prevent said bearing from passing through said opening on said smaller diameter side,
   whereby said lip on said larger diameter side is biased against said bearing means as said tire travels, and said tire is prevented from moving off said bearing means at either side.

2. The apparatus of claim 1 in which said tire is made of plastic.

3. The apparatus of claim 2 in which said plastic comprises polyformaldehyde.

4. The apparatus of claim 1 further comprising a track, and wherein said tire engages said track.

5. The apparatus of claim 4 in which said track has two surfaces oppositely inclined to the horizontal, and further comprising a second bearing means and a second tire mounted on said support, each said tire having a circumference that increases from a smaller diameter side to a larger diameter side and a lip extending radially inward over a portion of said bearing means on the larger diameter side of said tire, each said tire engaging a said surface.

6. The apparatus of claim 5 in which said two surfaces are two upper inclined surfaces, and in which said track further comprises two lower surfaces oppositely inclined to the horizontal, and further comprising third and fourth bearing means and tires engaging said lower inclined surfaces, each said third and fourth tire having a circumference that increases from a smaller diameter side to a larger diameter side and a lip extending radially inward over a portion of said bearing means on the larger diameter side of said tire.

7. The apparatus of claim 5 in which said circumferences of said tires increase away from said support member.

8. Apparatus for moving objects on a carrier in a clean environment without particulate contamination, said apparatus including
   a support member adapted to support said carrier,
   a plurality of bearing means connected to said support member, each said bearing means having a cylindrical surface over the entire outer diameter surface,
   a plurality of tires mounted on said bearing means, each said tire being made of material softer than said bearing means and having a circumference that increases from a smaller diameter side to a larger diameter side, an opening on the smaller diameter side, an opening on the larger diameter side, and a lip extending radially inward over a portion of said bearing means at said larger diameter side of said tire a sufficient amount to prevent said bearing means from passing through the opening on said larger diameter side, the opening on the smaller diameter side being larger than said opening on said larger diameter side and being sufficiently large so as to not prevent said bearing from passing through said opening on said smaller diameter side, and
   a track engaged by said tires,
   whereby each said lip on said larger diameter side is biased against said bearing means as said tires travel, and each said tire is prevented from moving off said bearing means at either side.

9. The apparatus of claim 8 in which said tires are made of plastic.

10. The apparatus of claim 9 in which said plastic comprises polyformaldehyde.

11. The apparatus of claim 8 in which said track has two surfaces oppositely inclined to the horizontal, and said tires engage both said surfaces.

12. The apparatus of claim 11 in which said two surfaces are two upper inclined surfaces, said track further comprises two lower surfaces oppositely inclined to the horizontal, and some of said tires engage said lower surfaces.

13. The apparatus of claim 11 in which said circumferences of said tires increase away from said support member.

14. The apparatus of claim 8 in which said apparatus is a machine for placing semiconductor wafers in said carrier.

15. The apparatus of claim 8 in which said rollers and track are contained within a housing.

* * * * *